United States Patent
Iizuka (10) Patent No.: US 11,621,151 B2
(45) Date of Patent: Apr. 4, 2023

(54) UPPER ELECTRODE AND PLASMA PROCESSING APPARATUS

(71) Applicant: TOKYO ELECTRON LIMITED, Tokyo (JP)

(72) Inventor: Hachishiro Iizuka, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 128 days.

(21) Appl. No.: 17/052,020

(22) PCT Filed: Apr. 26, 2019

(86) PCT No.: PCT/JP2019/018147
§ 371 (c)(1),
(2) Date: Oct. 30, 2020

(87) PCT Pub. No.: WO2019/212059
PCT Pub. Date: Nov. 7, 2019

(65) Prior Publication Data
US 2021/0142989 A1 May 13, 2021

(30) Foreign Application Priority Data
May 2, 2018 (JP) .............................. JP2018-088686

(51) Int. Cl.
*H01L 21/00* (2006.01)
*H01J 37/32* (2006.01)
(Continued)

(52) U.S. Cl.
CPC .... *H01J 37/32568* (2013.01); *C23C 16/4586* (2013.01); *C23C 16/45536* (2013.01);
(Continued)

(58) Field of Classification Search
None
See application file for complete search history.

(56) References Cited

U.S. PATENT DOCUMENTS 5,834,730 A * 11/1998 Suzuki .............. H01J 37/32009
156/345.55
7,645,341 B2 * 1/2010 Kennedy ........... H01J 37/32522
156/345.43
(Continued)

FOREIGN PATENT DOCUMENTS

JP 08227880 A * 9/1996
JP 2008-257920 A 10/2008
(Continued)

OTHER PUBLICATIONS

PCT International Search Report and Written Opinion, PCT Application No. PCT/JP2019/018147, dated Jul. 16, 2019, 10 pages (with English translation of International Search Report).

*Primary Examiner* — Sylvia MacArthur
*Assistant Examiner* — Michelle Crowell
(74) *Attorney, Agent, or Firm* — Fenwick & West LLP (57) ABSTRACT

An upper electrode includes a central electrode, a peripheral electrode, multiple dielectric bodies, and multiple power supply electrodes. The central electrode is disposed on a counter surface of the upper electrode facing a substrate support, on which a target object that is a plasma processing target is placed, at a position corresponding to a central portion of the substrate support. The peripheral electrode is disposed on the counter surface to encircle a periphery of the central electrode. The dielectric bodies are laminated between the counter surface and a surface of the upper electrode opposite to the counter surface. The power supply electrode is arranged between the dielectric bodies to electrically connect the central electrode and the peripheral electrode respectively to power supply terminals individually disposed at the surface opposite to the counter surface.

14 Claims, 8 Drawing Sheets

(51) Int. Cl.
*C23C 16/455* (2006.01)
*C23C 16/458* (2006.01)
*C23C 16/50* (2006.01)

(52) U.S. Cl.
CPC ........ *C23C 16/50* (2013.01); *H01J 37/32183* (2013.01); *H01J 37/32715* (2013.01); *H01J 2237/332* (2013.01)

(56) References Cited

U.S. PATENT DOCUMENTS

| | | | | |
|---|---|---|---|---|
| 2008/0182418 | A1* | 7/2008 | Collins | C23C 16/45574 438/729 |
| 2009/0111276 | A1* | 4/2009 | Dhindsa | C23C 16/46 700/121 |
| 2010/0151687 | A1* | 6/2010 | Dhindsa | H01J 37/32009 438/710 |
| 2011/0241547 | A1* | 10/2011 | Wei | H01J 37/32174 315/111.21 |
| 2014/0007812 | A1* | 1/2014 | Chang | H01J 37/32541 315/111.21 |
| 2014/0320016 | A1* | 10/2014 | Chang | H01J 37/32082 315/111.41 |
| 2014/0363587 | A1* | 12/2014 | Huh | H01J 37/32449 118/723 R |
| 2017/0213703 | A1* | 7/2017 | Sakane | H01J 37/3299 |
| 2019/0048468 | A1* | 2/2019 | Yoshimura | H05H 1/24 |
| 2019/0051496 | A1* | 2/2019 | Collins | H01J 37/32174 |

FOREIGN PATENT DOCUMENTS

| | | |
|---|---|---|
| JP | 2014-093436 A | 5/2014 |
| JP | 2017-134950 A | 8/2017 |
| KR | 10-1236397 B1 | 2/2013 |
| KR | 10-1427732 B1 | 8/2014 |

* cited by examiner

UPPER ELECTRODE AND PLASMA PROCESSING APPARATUS

TECHNICAL FIELD

The present disclosure relates to an upper electrode and a plasma processing apparatus.

BACKGROUND

A capacitively coupled plasma processing apparatus in which parallel plate electrodes are disposed in a processing chamber has been known. In the capacitively coupled plasma processing apparatus, an upper electrode and a lower electrode are arranged in parallel within the pressure-reducible processing chamber, and a target substrate, for example, a semiconductor wafer, is placed on the lower electrode. The plasma processing apparatus generates plasma by applying a radio frequency power having a predetermined frequency to the upper electrode while supplying a predetermined processing gas into the processing chamber (see, e.g., Patent Document 1).

Patent Document 1: Japanese Patent Application Publication No. 2014-93436

The present disclosure provides a technique capable of suppressing noise.

SUMMARY

In accordance with an aspect of the present disclosure, there is provided an upper electrode including a central electrode, one or more peripheral electrodes, multiple dielectric bodies, and multiple power supply electrodes. The central electrode is disposed on a counter surface of the upper electrode facing a substrate support, on which a target object that is a plasma processing target is placed, at a position corresponding to a central portion of the substrate support. The one or more peripheral electrodes are disposed on the counter surface to encircle a periphery of the central electrode. The multiple dielectric bodies are laminated between the counter surface and a surface of the upper electrode opposite to the counter surface. The multiple power supply electrodes are arranged between the multiple dielectric bodies to electrically connect the central electrode and the one or more peripheral electrodes respectively to power supply terminals that are individually disposed at the surface opposite to the counter surface.

Effect of the Invention

In accordance with the aspect of the present disclosure, it is possible to suppress noise.

DETAILED DESCRIPTION

Hereinafter, embodiments of an upper electrode and a plasma processing apparatus of the present disclosure will be described in detail with reference to the accompanying drawings. The following embodiments are not intended to limit the upper electrode and the plasma processing apparatus of the present disclosure. Further, the following embodiments can be appropriately combined without contradicting processing contents thereof.

In the plasma processing apparatus, noise may be generated due to a radio frequency applied to generate plasma, which may cause problems such as malfunctioning. Therefore, it is desirable to suppress the noise.

First Embodiment

Configuration of the Plasma Processing Apparatus

Figure 1:
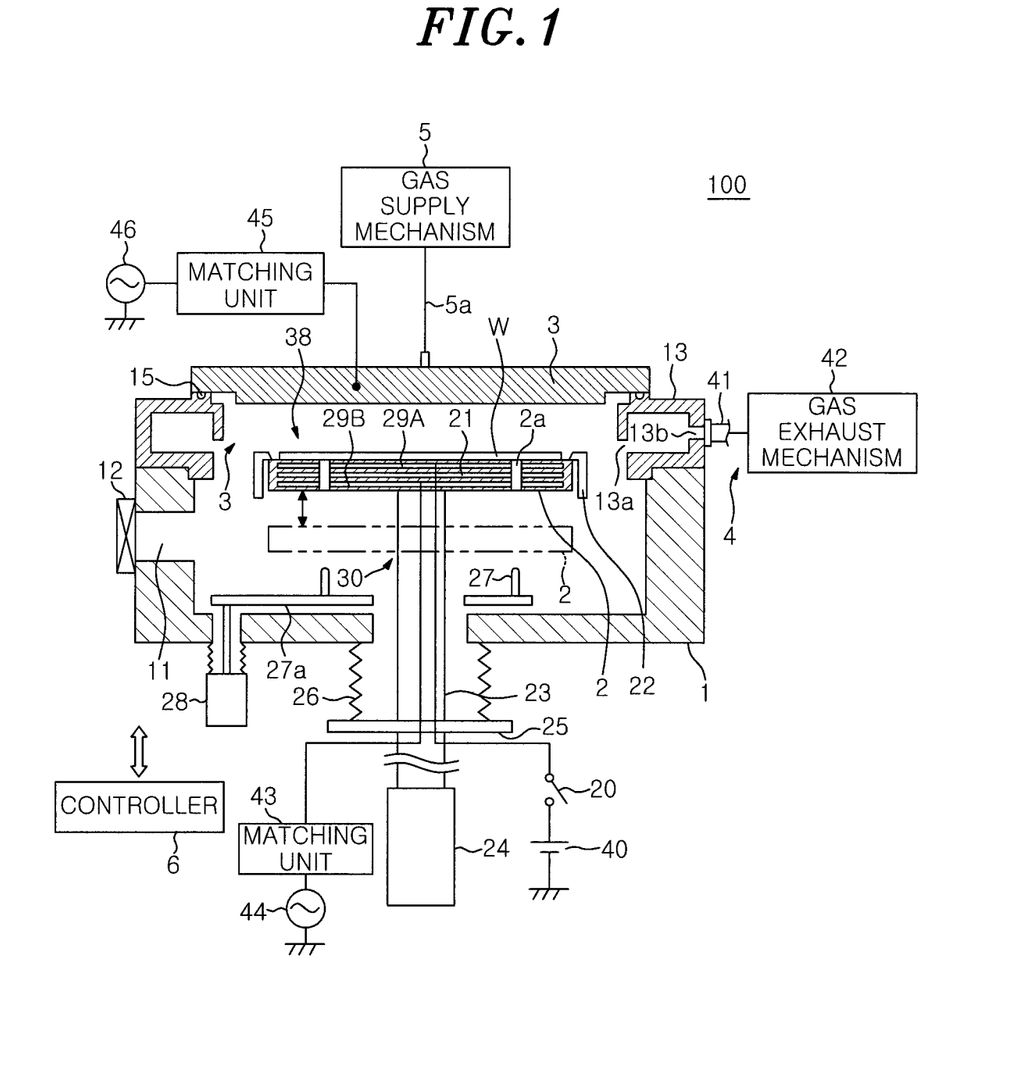
FIG. 1 is a schematic cross-sectional view showing an example of a configuration of a plasma processing apparatus according to a first embodiment.

Hereinafter, a configuration of a plasma processing apparatus according to an embodiment will be described. In the following description, a case in which the plasma processing apparatus performs film formation as a plasma treatment on a semiconductor wafer will be described as an example. FIG. 1 is a schematic cross-sectional view showing an example of a configuration of the plasma processing apparatus according to a first embodiment. A plasma processing apparatus 100 includes a processing chamber 1, a substrate support 2, an upper electrode 3, a gas exhaust unit 4, a gas supply mechanism 5, and a controller 6.

The processing chamber 1 is made of a metal such as aluminum and has a substantially cylindrical shape.

A loading/unloading port 11 for loading and unloading a wafer W is formed on a sidewall of the processing chamber 1. The loading/unloading port 11 is opened and closed by a gate valve 12. An annular gas exhaust duct 13 having a rectangular cross section is disposed on a main body of the processing chamber 1. A slit 13a is formed in the gas exhaust duct 13 along an inner peripheral surface of the gas exhaust duct 13. A gas exhaust port 13b is formed on an outer wall of the gas exhaust duct 13. An upper electrode 3 is disposed on an upper surface of the gas exhaust duct 13 to block a top opening of the processing chamber 1. A space between the gas exhaust duct 13 and the upper electrode 3 is airtightly sealed with a seal 15.

The substrate support 2 is configured to horizontally support the wafer W in the processing chamber 1. The substrate support 2 is formed in a disc shape having a size corresponding to a size of the wafer W. The substrate support 2 is supported by a support member 23. The substrate support 2 is made of a ceramic material such as aluminum nitride (AlN) or a metal material such as aluminum or a nickel alloy. The substrate support 2 has therein a heater 21 for heating the wafer W, an electrostatic attraction electrode 29A, and a radio frequency (RF) electrode 29B. The heater 21 is configured to generate heat by the power supplied from a heater power supply (not shown). An output of the heater 21 is controlled by a temperature signal of a fiber thermometer (not shown) disposed near an upper surface of the substrate support 2. Accordingly, a temperature of the wafer W is controlled to a predetermined temperature.

A first radio frequency (RF) power supply 44 is electrically coupled to the RF electrode 29B through a matching unit 43. The matching unit 43 has a variable capacitor and an impedance control circuit. Thus, the matching unit 43 is configured to control at least one of a capacitance and an impedance. The matching unit 43 matches a load impedance with an internal impedance of the first RF power supply 44. The first RF power supply 44 is configured to apply the power having a predetermined frequency for attracting ions in the plasma to the substrate support 2 through the RF electrode 29B. For example, the first RF power supply 44 applies a RF power of 13.56 MHz for ion attraction to the substrate support 2 through the RF electrode 29B. In other words, the substrate support 2 also functions as a lower electrode.

The electrostatic attraction electrode 29A is electrically coupled to an attraction power supply 40 through an ON/OFF switch 20 disposed external to the processing chamber 1. A predetermined DC voltage is applied from the attraction power supply 40 to the electrostatic attraction electrode 29A. A DC voltage applied to the electrostatic attraction electrode 29A generates a Coulomb force, thus causing the electrostatic attraction electrode 29A to attract and hold the wafer W.

The upper electrode 3 is disposed above the substrate support 2 to face the substrate support 2. In the case of performing a plasma treatment, a RF power of a predetermined frequency is applied to the upper electrode 3. For example, a second RF power supply 46 serving as a power supply is electrically coupled to the upper electrode 3 through a matching unit 45. The matching unit 45 has a variable capacitor and an impedance control circuit. Thus, the matching unit 45 is configured to control at least one of a capacitance and an impedance. The matching unit 45 matches the load impedance with an internal impedance of the second RF power supply 46. The second RF power supply 46 is configured to apply the power having a predetermined frequency for plasma generation to the upper electrode 3. For example, the second RF power supply 46 applies a RF power of 13.56 MHz to the upper electrode 3.

The gas supply mechanism 5 is connected to the upper electrode 3. The gas supply mechanism 5 is connected to gas supply sources of various gases used for the plasma treatment through gas supply lines (not shown). Each gas supply line is appropriately branched depending on processes of the plasma treatment, and is provided with an opening/closing valve and a flow rate controller. The gas supply mechanism 5 is configured to control flow rates of various gases by controlling the opening/closing valves and the flow rate controllers provided in the respective gas supply lines. The gas supply mechanism 5 supplies various gases used for the plasma treatment to the upper electrode 3.

A flow channel is formed in the upper electrode 3 so that various gases are supplied from the gas supply mechanism 5 into the processing chamber 1 through the flow channel. In other words, the upper electrode 3 also functions as a gas supply for supplying various gases. A specific configuration of the upper electrode 3 will be described later.

The substrate support 2 is provided with a cover member 22 that is made of ceramic such as alumina and covers an outer peripheral region of an upper surface and a side surface of the substrate support 2. An adjusting mechanism 30 for adjusting a gap between the upper electrode 3 and the substrate support 2 is connected to a bottom surface of the substrate support 2. The adjusting mechanism 30 includes the support member 23 and a lifter 24. The support member 23 supports the substrate support 2 at the center of the bottom surface of the substrate support 2. Further, the support member 23 extends through a hole formed in a bottom wall of the processing chamber 1 up to a position below the processing chamber 1. A lower end of the support member 23 is connected to the lifter 24. The substrate support 2 is vertically moved by vertically moving the lifter 24 with the support member 23. The adjusting mechanism 30 causes the lifter 24 to vertically move the substrate support 2 between a processing position indicated by a solid line in FIG. 1 and a transfer position at which the wafer W can be transferred. The transfer position is indicated by a double dotted line in FIG. 1 and disposed below the processing position. Thus, the wafer W can be loaded and unloaded.

A flange portion 25 is attached to a portion of the support member 23 below the processing chamber 1. A bellows 26 that is extended and contracted by the vertical movement of the substrate support 2 is disposed between an outer bottom surface of the processing chamber 1 and the flange portion 25 to partition an inner atmosphere of the processing chamber 1 and the external air.

Three wafer support pins 27 (only two are shown) are disposed near an inner bottom surface of the processing chamber 1 to protrude upward from an elevating plate 27a. The wafer support pins 27 are vertically moved with the elevating plate 27a by vertically moving a lifter 28 disposed below the processing chamber 1.

The wafer support pins 27 can protrude beyond and retract below the upper surface of the substrate support 2 through through-holes 2a formed in the substrate support 2 located at the transfer position. By vertically moving the wafer support pins 27, the wafer W is transferred between a transfer mechanism and the substrate support 2. A processing space 38 is formed between the substrate support 2 and the upper electrode 3 in a state where the substrate support 2 is located at the processing position.

The inside of the processing chamber 1 is exhausted by the gas exhaust unit 4. The gas exhaust unit 4 includes a gas exhaust line 41 connected to the gas exhaust port 13b, and a gas exhaust mechanism 42 having a vacuum pump, a pressure control valve, and the like connected to the gas exhaust line 41. During the treatment, a gas in the processing chamber 1 reaches the gas exhaust duct 13 through the slit 13a, and is exhausted from the gas exhaust duct 13 through the gas exhaust line 41 by the gas exhaust mechanism 42.

Figure 2:
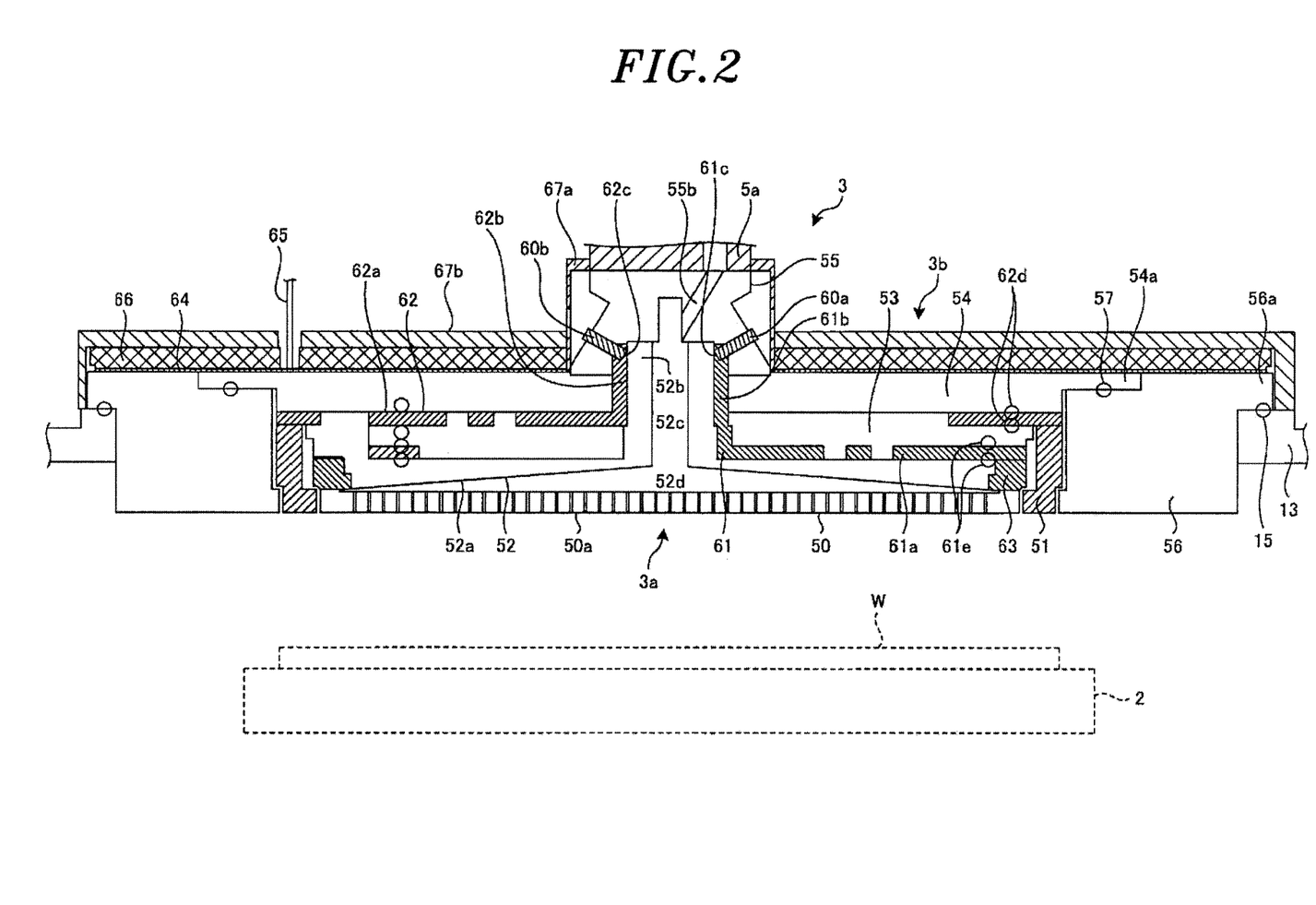
FIG. 2 is a cross-sectional view showing an example of the configuration of the upper electrode according to the first embodiment.

FIG. 2 is a cross-sectional view showing an example of the configuration of the upper electrode according to the first embodiment. The upper electrode 3 includes a central electrode 50 and a peripheral electrode 51 on a counter surface 3a facing the substrate support 2. Each of the central electrode 50 and the peripheral electrode 51 may be made of a conductive material such as aluminum or stainless steel.

The central electrode 50 is formed in a disc shape having a diameter smaller than that of the substrate support 2. The central electrode 50 is disposed on the counter surface 3a at a position corresponding to the central portion of the substrate support 2. The peripheral electrode 51 is formed in an annular shape having an inner diameter slightly greater than an outer diameter of the central electrode 50. The peripheral electrode 51 is disposed on the counter surface 3a to encircle a periphery of the central electrode 50.

The upper electrode 3 has a plurality of dielectric bodies laminated on the central electrode 50 and/or the peripheral electrode 51. The dielectric bodies may be made of ceramic such as alumina or glass such as quartz. For example, three dielectric bodies 52 to 54 are laminated in the upper electrode 3. The dielectric body 52 includes a plane portion 52a and a cylindrical portion 52b. The plane portion 52a has a size similar to that of the central electrode 50 and is formed at a lower portion of the dielectric body 52. The cylindrical portion 52b is formed at the center of the plane portion 52a. The dielectric body 53 is formed in a flat circular ring shape having a size similar to that of the dielectric body 52 and is disposed on the dielectric body 52 with the cylindrical portion 52b passing through a central hole of the dielectric body 53. The dielectric body 54 is formed in a flat circular ring shape having a size slightly greater than that of the dielectric body 53 and is disposed on the dielectric body 53 with the cylindrical portion 52b passing through a central hole of the dielectric body 54. The dielectric body 52 is fixed to the dielectric body 53 by screws (not shown) or the like. The dielectric body 53 is fixed to the dielectric body 54 by screws (not shown) or the like.

The central electrode 50 is disposed at a bottom surface of the plane portion 52a of the dielectric body 52 that faces the substrate support 2. The peripheral electrode 51 has a thickness substantially the same as the sum of the thicknesses of the dielectric bodies 52 and 53. The peripheral electrode 51 is disposed at the side surfaces of the dielectric bodies 52 and 53. The central electrode 50 is fixed to the dielectric body 52 by screws (not shown) or the like. The peripheral electrode 51 is fixed to at least one of the dielectric body 52 and the dielectric body 53 by screws (not shown) or the like.

On the dielectric body 54, a dielectric body 55 is disposed to cover the cylindrical portion 52b. A flow channel 52c is formed in the cylindrical portion 52b of the dielectric body 52 along the central axis. A gas inlet hole 55b communicating with the flow channel 52c is formed at the dielectric body 55. A gas supply line 5a is connected to the gas inlet hole 55b to supply various gases from the gas supply mechanism 5.

Further, a gas diffusion space 52d is formed between the central electrode 50 and the plane portion 52a. The gas diffusion space 52d is a disc-shaped space whose height increases toward the center. The gas diffusion space 52d communicates with the flow channel 52c at the center. Various gases are supplied to the gas diffusion space 52d through the flow channel 52c.

Multiple through-holes 50a are formed in the central electrode 50. The gas supplied to the gas diffusion space 52d is supplied in a shower pattern to the processing space 38 between the substrate support 2 and the upper electrode 3 through the through-holes 50a. In other words, the upper electrode 3 also functions as a gas supply for supplying various gases to the processing space 38.

Further, the upper electrode 3 has an annular dielectric body 56 that surrounds the dielectric bodies 52 to 54. An outer diameter of the dielectric body 56 is substantially the same as an inner diameter of the gas exhaust duct 13. An outwardly extending flange portion 54a may be formed on an outer peripheral portion of an upper surface of the dielectric body 54. The dielectric body 54 is fixed to the dielectric body 56 by, for example, screws (not shown) in a state where the flange portion 54a is engaged with the dielectric body 56. A seal 57 is disposed between the flange portion 54a and the dielectric body 56 to airtightly seal the gap therebetween. Further, an outwardly extending flange portion 56a is formed on an outer peripheral portion of an upper surface of the dielectric body 56, and the dielectric body 56 is fixed to the gas exhaust duct 13 by, for example, screws (not shown) in a state where the flange portion 56a is engaged with the gas exhaust duct 13. A seal 15 is disposed between the gas exhaust duct 13 and the flange portion 56a to airtightly seal the gap therebetween.

At the dielectric body 55, a power supply terminal to which the power of a predetermined frequency is supplied is formed. For example, power supply terminals 60a and 60b to which powers of predetermined frequencies from the second RF power supply 46 are individually supplied are formed at the dielectric body 55. The second RF power supply 46 is configured to individually control the powers supplied to the power supply terminals 60a and 60b. However, the plasma processing apparatus 100 may include a plurality of second RF power supplies 46 and a plurality of matching units 45 to correspond to the power supply terminals 60a and 60b, so that the second RF power supplies 46 can respectively supply the powers of predetermined frequencies to the power supply terminals 60a and 60b through the matching units 45.

The upper electrode 3 includes power supply electrodes for supplying RF powers of predetermined frequencies between the dielectric bodies. For example, the upper electrode 3 includes a power supply electrode 61 that electrically couples the central electrode 50 and the power supply terminal 60a between the dielectric body 52 and the dielectric body 53. Further, the upper electrode 3 includes a power supply electrode 62 that electrically couples the peripheral electrode 51 and the power supply terminal 60b between the dielectric body 53 and the dielectric body 54. Each of the power supply electrodes 61 and 62 may be made of a conductive material such as aluminum, stainless steel, or the like.

Figure 3A:
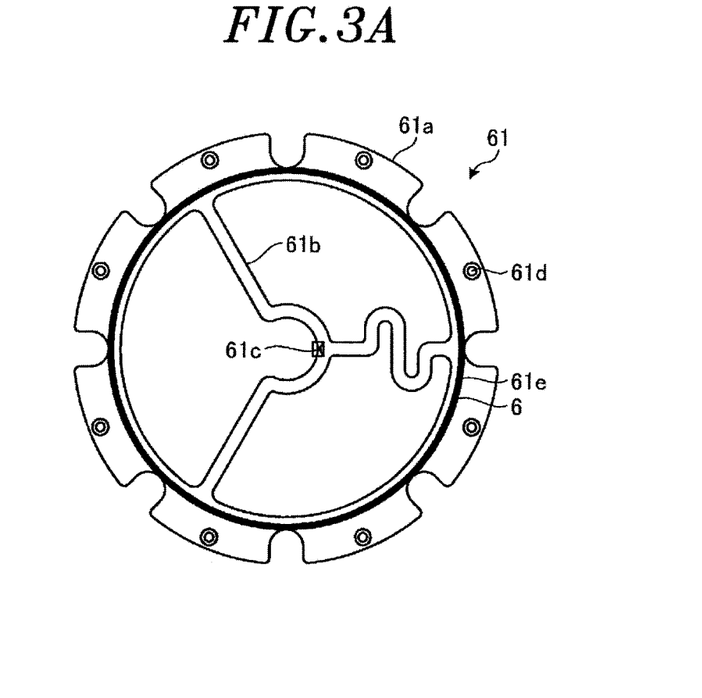
FIGS. 3A and 3B are plan views showing examples of configurations of power supply electrodes according to the first embodiment.
Figure 3B:
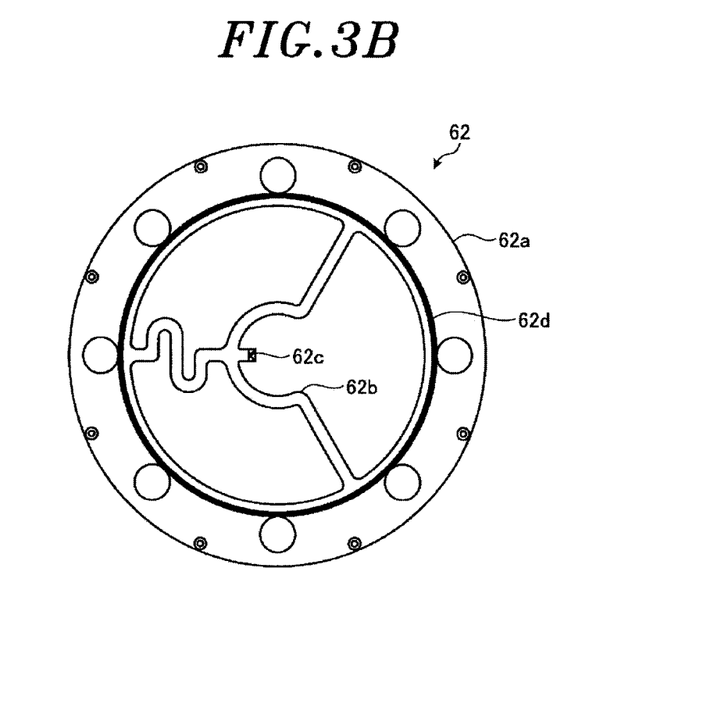

FIGS. 3A and 3B are plan views showing examples of the configurations of the power supply electrodes according to the first embodiment. FIG. 3A shows an example of the configuration of the power supply electrode 61. FIG. 3B shows an example of the configuration of the power supply electrode 62.

As shown in FIG. 3A, the power supply electrode 61 has an annular portion 61a and a plurality of conducting wire portions 61b. The conducting wire portions 61b are connected to one another around the center, and the power supply electrode 61 has a power supply point 61c where the power is supplied by contact with the power supply terminal 60a. Further, the conducting wire portions 61b are partially curved and bent so that the distances (lengths) to the annular portion 61a become equal (that is, the lengths of the conducting wire portions 61b from the power supply point 61c to the annular portion 61a are equal to one another), and the conducting wire portions 61b are connected to multiple points on the circumference of the annular portion 61a. As shown in FIG. 2, the power supply electrode 61 is electrically connected to the central electrode 50 at the annular portion 61a through a conductive ring electrode 63. The ring electrode 63 has an annular shape and is in contact with an outer edge of the central electrode 50. The power supply electrode 61 is electrically connected to the central electrode 50 through the ring electrode 63. As shown in FIG. 3A, multiple pin holes 61d spaced apart from each other at regular intervals are formed in the annular portion 61a of the power supply electrode 61. The ring electrode 63 is fixed by screws (not shown) through the pin holes 61d and fastened to the power supply electrode 61.

As shown in FIG. 3B, the power supply electrode 62 has an annular portion 62a and a plurality of conducting wire portions 62b. The conducting wire portions 62b are connected to one another around the center, and the power supply electrode 62 has a power supply point 62c where the power is supplied by contact with the power supply terminal 60b. Further, the conducting wire portions 62b are partially curved and bent so that the distances (lengths) to the annular portion 62a become equal (that is, the lengths of the conducting wire portions 62b from the power supply point 62c to the annular portion 62a are equal to one another), and the conducting wire portions 62b are connected to multiple points on the circumference of the annular portion 62a. Since the annular portion 62a is in contact with the peripheral electrode 51 as shown in FIG. 2, the power supply electrode 62 is electrically connected to the peripheral electrode 51 at the annular portion 62a.

Here, a RF current flows only on and near a surface of a conductor, which is known as skin effect. For example, a RF current of 13.56 MHz flows only to a depth of about 0.3 mm from a surface of aluminum and to a depth of about 0.02 mm from a surface of stainless steel. The RF current flows along the surface of the conductor from the power supply point to the electrode that generates plasma. For example, an RF current flows from the power supply point 61c to the central electrode 50 through the power supply electrode 61. The RF current flows from the power supply point 62c to the peripheral electrode 51 through the power supply electrode 62. In the present embodiment, the propagation paths of the RF power to each of the central electrode 50 and the peripheral electrode 51 become substantially uniform by using the power supply electrodes 61 and 62. Accordingly, the RF power can be uniformly propagated to each of the central electrode 50 and the peripheral electrode 51, and thus the plasma density distribution can become uniform.

In the power supply electrode 61, a seal 61e extends along the circumferential direction of the annular portion 61a. Further, in the power supply electrode 62, a seal 62d extends along the circumferential direction of the annular portion 62a.

The gap between the dielectric bodies 52 and 53 is airtightly sealed by the seal 61e. The gap between the dielectric bodies 53 and 54 is airtightly sealed by the seal 62d. In the plasma processing apparatus 100, a pressure in a space including an upper portion of the upper electrode 3 is set to an atmospheric pressure. Specifically, a predetermined gap (e.g., 0.2 mm to 2 mm) is formed between the dielectric bodies 52 and 53 and between the dielectric bodies 53 and 54 and a pressure in the space up to the positions of the seals 61e and 62d is set to the atmospheric pressure. In the upper electrode 3, by providing the gaps and setting a pressure in the space up to the position of the seals 62d to the atmospheric pressure, it is possible to suppress abnormal discharge caused by the atmosphere in the gaps.

In the upper electrode 3, a heater 64 serving as a heat generating unit is disposed on at least a part of an upper surface 3b opposite to the counter surface 3a facing the substrate support 2. The heater 64 generates heat by the power supplied from a heater power supply (not shown) through a wiring 65. In the case of performing film formation, the upper electrode 3 is heated to a temperature of 200° C. to 400° C. by the heater 64. A heat insulating material 66 is disposed on the heater 64 to suppress the heat release.

Further, the upper electrode 3 is provided with a conductive shield member that covers the entire upper surface 3b from the position above the heater 64. For example, the upper electrode 3 includes a conductive shield member 67a that covers the power supply terminals 60a and 60b. Further, the upper electrode 3 includes a conductive shield member 67b disposed on the entire upper surface of the heater 64.

The power of a predetermined frequency for plasma generation is applied from the second RF power supply 46 to the central electrode 50 and the peripheral electrode 51 of the upper electrode 3 through the matching unit 45. The matching unit 45 includes a variable capacitor and an impedance control circuit, and is configured to control at least one of a capacitance and an impedance.

Figure 4:
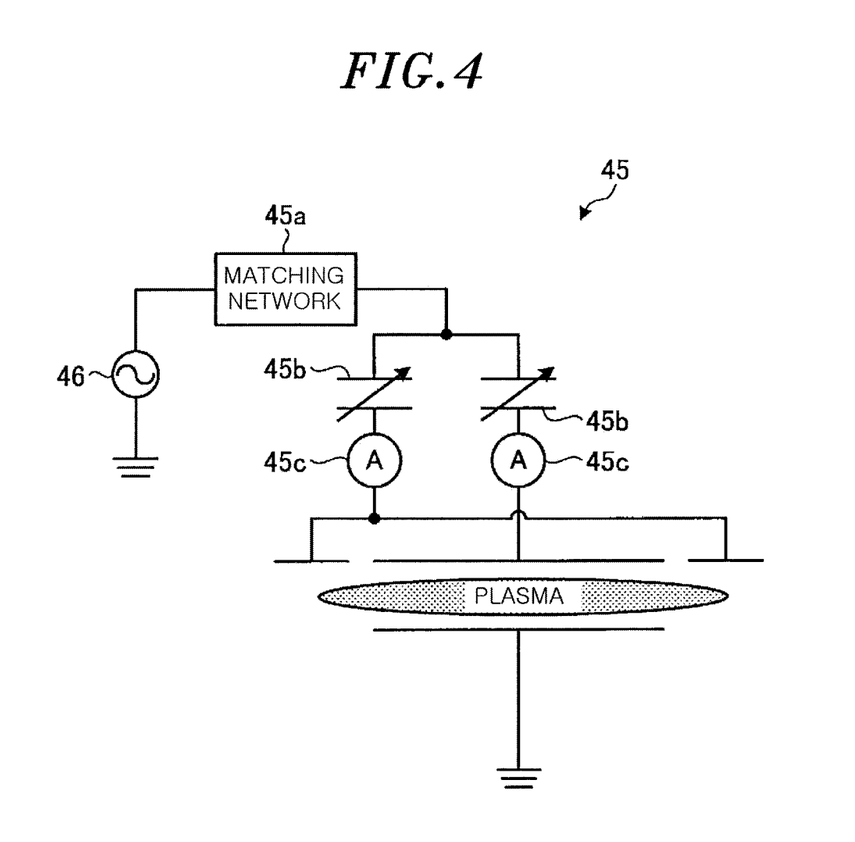
FIG. 4 shows an example of an electrical configuration of a supply path for supplying power to a central electrode and a peripheral electrode.

FIG. 4 shows an example of an electrical configuration of a supply path for supplying powers to the central electrode 50 and the peripheral electrode 51. As shown in FIG. 4, the supply path for supplying the powers from the second RF power supply 46 to the central electrode 50 and the peripheral electrode 51 is provided with the matching unit 45 including a matching network 45a for controlling an impedance, variable capacitors 45b and current monitors 45c. For example, the matching unit 45 adjusts a capacitance and an impedance and matches the load impedance with the internal impedance of the second RF power supply 46.

Referring back to FIG. 1, the operation of the plasma processing apparatus 100 configured as described above is generally controlled by the controller 6. The controller 6 is, e.g., a computer, and includes a central processing unit (CPU), a random access memory (RAM), a read only memory (ROM), an auxiliary storage device, and the like. The CPU operates based on a program stored in the ROM or the auxiliary storage device or based on processing conditions of a plasma treatment to control the overall operation of the plasma processing apparatus. For example, the controller 6 controls the supply of various gases from the gas supply mechanism 5, the vertical movement of the lifter 24, the operation of exhausting the processing chamber 1 using the gas exhaust mechanism 42, and the supply of powers from the first RF power supply 44 and the second RF power supply 46. A computer-readable program required for the above control may be stored in a storage medium. The storage medium includes, e.g., a flexible disk, a compact disk (CD), a CD-ROM, a hard disk, a flash memory, a DVD, or the like. Further, the controller 6 may be disposed inside the plasma processing apparatus 100 or outside the plasma processing apparatus 100. When the controller 6 is disposed outside the plasma processing apparatus 100, the controller 6 can control the plasma processing apparatus 100 using a wired or wireless communication device.

Next, the sequence of the plasma treatment performed by the plasma processing apparatus 100 under the control of the controller 6 will be briefly described. The plasma processing apparatus 100 reduces a pressure in the processing chamber 1 to a vacuum atmosphere using the gas exhaust mechanism 42. In the plasma processing apparatus 100, in the case of loading the wafer W, the substrate support 2 is lowered to the wafer transfer position and the gate valve 12 is opened. The wafer W is loaded through the loading/unloading port 11 and placed on the substrate support 2 by the wafer transfer mechanism. The plasma processing apparatus 100 closes the gate valve 12 and the substrate support 2 is raised to the wafer processing position.

After the pressure in the processing chamber 1 is adjusted, the plasma processing apparatus 100 supplies RF power of a predetermined frequency to the upper electrode 3 and the substrate support 2 while supplying various gases used for the plasma treatment from the upper electrode 3 into the processing chamber 1, thereby generating plasma.

However, in the plasma processing apparatus 100, noise may be generated due to the RF power applied to generate plasma, and thus problems such as malfunctioning and the like may occur as described above.

Therefore, in the upper electrode 3 of the present embodiment, the dielectric bodies 52 to 54 are laminated, and the power supply electrodes 61 and 62 are arranged between the dielectric bodies 52 to 54. Accordingly, in the plasma processing apparatus 100, noise can be suppressed even when the RF power is supplied to the power supply electrodes 61 and 62 to generate plasma. This is because noise of the RF power is attenuated by the dielectric bodies 52 to 54. Further, the upper electrode 3 is provided with the shield members 67a and 67b that cover the entire upper surface 3b. Accordingly, in the plasma processing apparatus 100, the propagation of noise toward the upper surface 3b of the upper electrode 3 can be prevented.

Meanwhile, since the upper electrode 3 of the present embodiment is provided with the shield members 67a and 67b disposed above the heater 64, the RF noise is generated at the wiring 65 although it is attenuated. Therefore, it is preferred to provide a noise removing filter for removing the RF noise at the wiring 65. In the plasma processing apparatus 100 of the present embodiment, the noise removing filter is provided at the wiring 65, and the power is supplied to the heater 64 through the noise removing filter.

Further, in the plasma processing apparatus 100 of the present embodiment, the plasma density can be controlled using the central electrode 50 and the peripheral electrode 51. The plasma density changes depending on the applied RF power. Therefore, in the plasma processing apparatus 100, the controller 6 controls the powers supplied from the second RF power supply 46 to the central electrode 50 and the peripheral electrode 51 to control the gradient of the plasma density. For example, the controller 6 controls the plasma density to have a forward gradient such that the plasma density increases outward from the center of the substrate support 2 or a reverse gradient such that the plasma density decreases outward from the center of the substrate support 2. In the plasma processing apparatus 100, the plasma density has the forward gradient or the reverse gradient, so that it is possible to control the supply amount of dissociated ions or particles and also possible to control the in-plane progress of the plasma treatment at the central portion and the peripheral portion of the wafer W. Further, for example, in plasma enhanced atomic layer deposition (PE-ALD), a time period and a cycle required to generate plasma by applying the RF power is short, and thus it is important to control the plasma density. In response thereto, the plasma processing apparatus 100 can control the plasma density to be suitable for formation of a PE-ALD film.

As described above, the upper electrode 3 of the present embodiment includes the central electrode 50, the peripheral electrode 51, the dielectric bodies 52 to 54, and the power supply electrodes 61 and 62. The central electrode 50 is disposed on the counter surface 3a facing the substrate support 2, on which the wafer W that is a plasma processing target is placed, at a position corresponding to the central portion of the substrate support 2. The peripheral electrode 51 is disposed on the counter surface 3a to encircle the periphery of the central electrode 50. The dielectric bodies 52 to 54 are laminated between the counter surface 3a and the upper surface 3b opposite to the counter surface 3a. The power supply electrodes 61 and 62 are arranged between the dielectric bodies 52 to 54 to electrically connect the central electrode 50 and the peripheral electrode 51 respectively to the power supply terminals 60a and 60b that are individually disposed at the upper surface 3b. Accordingly, the upper electrode 3 of the present embodiment is configured to suppress noise.

Further, the power supply electrodes 61 and 62 of the present embodiment are electrically connected to the central electrode 50 and the peripheral electrode 51 at the annular portions 61a and 62a, respectively, and the power supply terminals 60a and 60b are connected to multiple points on the circumferences of the annular portions 61a and 62a by the conducting wire portions 61b and 62b that are formed to have the same length. Accordingly, in the upper electrode 3 of the present embodiment, the RF power can be uniformly propagated to each of the central electrode 50 and the peripheral electrode 51, and thus the plasma density distribution can become uniform.

Further, the dielectric bodies 52 to 54 of the present embodiment are laminated with the predetermined gaps therebetween. The power supply electrodes 61 and 62 are provided with the seals 61e and 62d extending along the circumferential direction of the annular portions 61a and 62a to seal off the atmosphere, respectively. Accordingly, the upper electrode 3 of the present embodiment can suppress abnormal discharge.

The upper electrode 3 of the present embodiment further includes the heater 64 and the shield members 67a and 67b. The heater 64 is disposed to cover at least a part of the upper surface 3b and generates heat by the power supplied through the noise removing filter. The shield members 67a and 67b cover the entire upper surface 3b from the position above the heater 64. Accordingly, the upper electrode 3 of the present embodiment can shield the propagation of noise. Further, the upper electrode 3 of the present embodiment can efficiently heat the upper electrode 3.

Further, the plasma processing apparatus 100 of the present embodiment includes the second RF power supply 46 serving as the power supply and the controller 6. The second RF power supply 46 is connected to the power supply terminals 60a and 60b and supplies the powers of predetermined frequencies to the central electrode 50 and the peripheral electrode 51 through the power supply terminals 60a and 60b, respectively. The controller 6 controls the powers supplied from the second RF power supply 46 to the central electrode 50 and the peripheral electrode 51 such that the plasma density during the plasma processing has a predetermined gradient. Accordingly, the plasma processing apparatus 100 of the present embodiment can control the gradient of the plasma density and can control the in-plane progress of the plasma treatment of the wafer W.

Further, in the plasma processing apparatus 100 of the present embodiment, at least one of a variable capacitor and an impedance control circuit is disposed in the supply paths for supplying the powers from the second RF power supply 46 to the central electrode 50 and the peripheral electrode 51, and at least one of a capacitance and an impedance can be controlled. Accordingly, the plasma processing apparatus 100 of the present embodiment can control the capacitance and the impedance to suppress RF reflected waves or noise that propagates to the supply paths.

Second Embodiment

Next, a second embodiment will be described. Since a plasma processing apparatus 100 according to the second embodiment has the same configuration as that of the plasma processing apparatus 100 according to the first embodiment, the redundant description thereof will be omitted.

Figure 5:
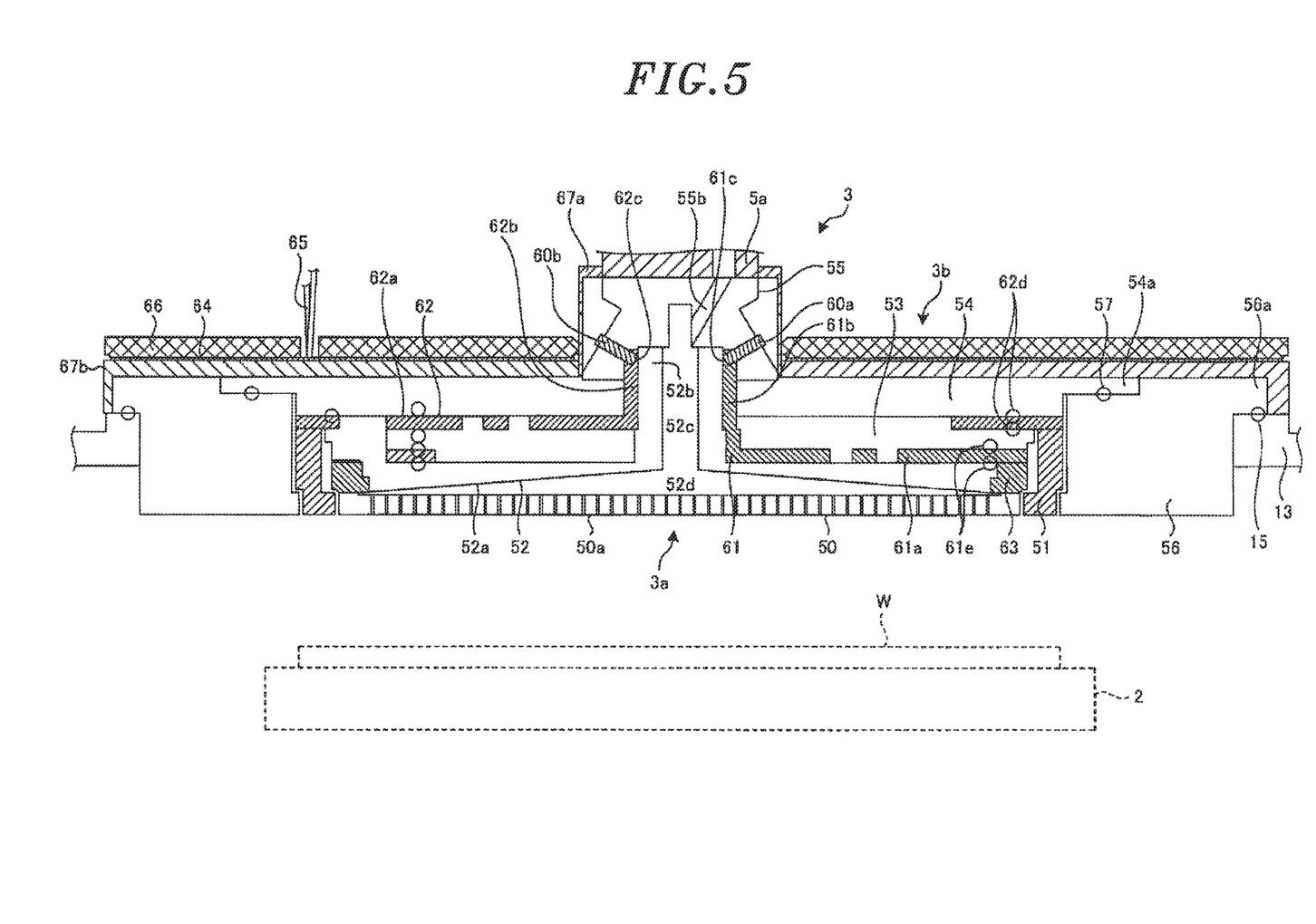
FIG. 5 is a cross-sectional view showing an example of a configuration of an upper electrode according to a second embodiment.

FIG. 5 is a cross-sectional view showing an example of a configuration of an upper electrode according to the second embodiment. Since an upper electrode 3 according to the second embodiment has the same configuration as that of the upper electrode 3 according to the first embodiment, like reference numerals will be given to like parts and redundant description thereof will be omitted. Thus, the differences will be mainly described.

In the upper electrode 3 according to the second embodiment, a conductive shield member 67b is disposed on the entire upper surface 3b opposite to the counter surface 3a facing the substrate support 2.

In the upper electrode 3, a heater 64 serving as a heat generating unit is disposed on at least a part of an upper surface of the shield member 67b. The heater 64 generates heat by the power supplied from a heater power supply (not shown) through the wiring 65. In the case of performing film formation, the upper electrode 3 is heated to a temperature of 200° C. to 400° C. by the heater 64. A heat insulating material 66 is disposed above the heater 64 to suppress the heat release.

Further, in the upper electrode 3, the shield member 67b is disposed under the heater 64. Therefore, the plasma processing apparatus 100 can shield the propagation of noise toward a portion above the upper electrode 3. Accordingly, in the plasma processing apparatus 100, it is unnecessary to provide a noise removing filter in the wiring 65 for supplying the power to the heater 64, which enables to simplify the configuration.

As described above, the upper electrode 3 of the second embodiment includes the heater 64 and the shield members 67a and 67b. The shield members 67a and 67b cover the entire upper surface 3b. The heater 64 is disposed to cover at least a part of the upper portion of the shield member 67b, and generates heat by the power supplied thereto. Accordingly, in the upper electrode 3 of the second embodiment, it is unnecessary to provide a noise removing filter in the wiring 65 for supplying the power to the heater 64, which enables to simplify the configuration of the plasma processing apparatus 100.

Third Embodiment

Next, a third embodiment will be described. Since a plasma processing apparatus 100 according to the third embodiment has the same configuration as that of the plasma processing apparatus 100 according to the first embodiment, the redundant description thereof will be omitted.

Figure 6:
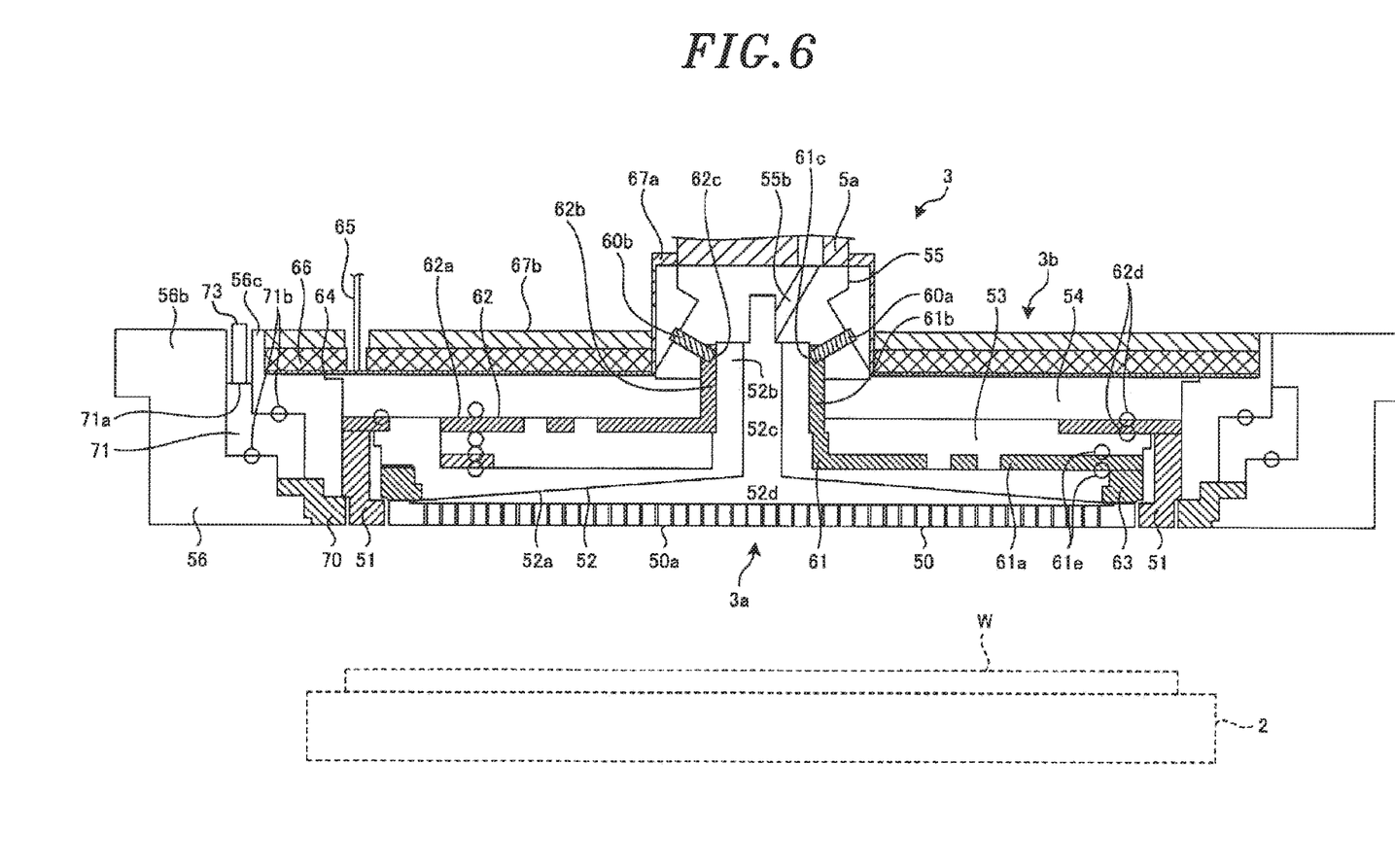
FIG. 6 is a cross-sectional view showing an example of a configuration of an upper electrode according to a third embodiment.

FIG. 6 is a cross-sectional view showing an example of a configuration of an upper electrode according to the third embodiment. Since an upper electrode 3 according to the third embodiment has the same configuration as the upper electrode 3 according to the first embodiment, like reference numerals will be given to like parts and redundant description thereof will be omitted. Thus, the differences will be mainly described.

In the upper electrode 3 according to the third embodiment, multiple peripheral electrodes having different diameters are arranged in parallel on a counter surface of the upper electrode 3. For example, in the upper electrode 3 according to the third embodiment, on a counter surface 3a facing a substrate support 2, a peripheral electrode 70 is disposed at an outer side of a peripheral electrode 51. The peripheral electrode 70 is formed in an annular shape having an inner diameter slightly greater than an outer diameter of the peripheral electrode 51 to encircle a periphery of the peripheral electrode 51. The peripheral electrode 70 may be made of a conductive material such as aluminum, stainless steel, or the like.

A dielectric body 56 is divided into a dielectric body 56b and a dielectric body 56c, and a power supply electrode 71 is disposed between the dielectric bodies 56b and 56c. Further, the dielectric body 56 is provided with a power supply terminal 73 to which a power of a predetermined frequency from a second RF power supply 46 is supplied. The power supply electrode 71 may be made of a conductive material such as aluminum, stainless steel, or the like. The plasma processing apparatus 100 may include a plurality of second RF power supplies 46 and a plurality of matching units 45 to correspond to the power supply terminals 60a, 60b, and 73, so that the second RF power supplies 46 can respectively supply the powers of predetermined frequencies to the power supply terminals 60a, 60b, and 73 through the matching unit 45.

Figure 7:
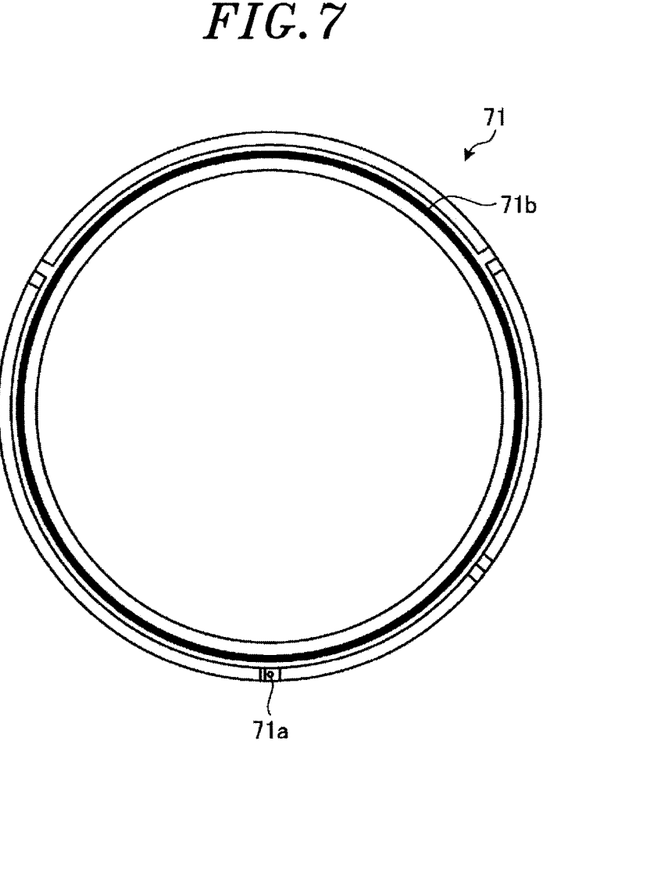
FIG. 7 is a plan view showing an example of a configuration of a power supply electrode according to the third embodiment.

FIG. 7 is a plan view showing an example of the configuration of the power supply electrode according to the third embodiment. FIG. 7 shows an example of the configuration of the power supply electrode 71.

The power supply electrode 71 is formed in an annular shape and has a power supply point 71a where a power is supplied by contact with the power supply terminal 73. As shown in FIG. 6, the power supply electrode 71 is in contact with the peripheral electrode 70 and, thus, is electrically connected with the peripheral electrode 70. The second RF power supply 46 can individually control the powers supplied to the power supply terminals 60a, 60b, and 73.

Seals 71b are disposed on both sides of the power supply electrode 71 while extending along the circumferential direction. The gap between the dielectric body 56b and the dielectric body 56c is airtightly sealed by the seals 71b. In the plasma processing apparatus 100, a pressure in the space including an upper portion of the upper electrode 3 is set to an atmospheric pressure. Specifically, a predetermined gap (e.g., 0.2 mm to 2 mm) is formed between the dielectric bodies 56b and 56c and a pressure in the space up to the position of the seals 71b is set to the atmospheric pressure.

In the upper electrode 3 of the third embodiment, the power supply electrode 71 is disposed between the dielectric bodies 56b and 56c. Therefore, in the plasma processing apparatus 100, noise can be suppressed even when the RF power is supplied to the power supply electrode 71 to generate plasma. This is because the RF noise is attenuated by the dielectric bodies 56b and 56c.

Further, the plasma processing apparatus 100 of the third embodiment can control the plasma density in various manners using the central electrode 50 and the peripheral electrodes 51 and 70. For example, in the plasma processing apparatus 100, the controller 6 controls the powers supplied from the second RF power supply 46 to the central electrode 50 and the peripheral electrodes 51 and 70 such that the plasma density has a forward gradient or a reverse gradient. Further, in the plasma processing apparatus 100, it is possible to control the plasma density at the peripheral electrode 51 increases or decreases compared to the plasma densities of the central electrode 50 and the peripheral electrode 70. Accordingly, the plasma processing apparatus 100 of the third embodiment can control the in-plane progress of the plasma treatment of the wafer W in various manners.

As described above, in the upper electrode 3 of the third embodiment, the peripheral electrodes 51 and 70 having different diameters are arranged in parallel on the counter surface 3a. The power supply electrodes 62 and 71 electrically connect the peripheral electrodes 51 and 70 to the power supply terminals 60b and 73 individually disposed at the upper surface 3b. Accordingly, the plasma processing apparatus 100 of the third embodiment can control the plasma density in various manners.

Fourth Embodiment

Next, a fourth embodiment will be described. Since a plasma processing apparatus 100 according to the fourth embodiment has the same configuration as that of the plasma processing apparatus 100 according to the first embodiment, the redundant description thereof will be omitted.

Figure 8:
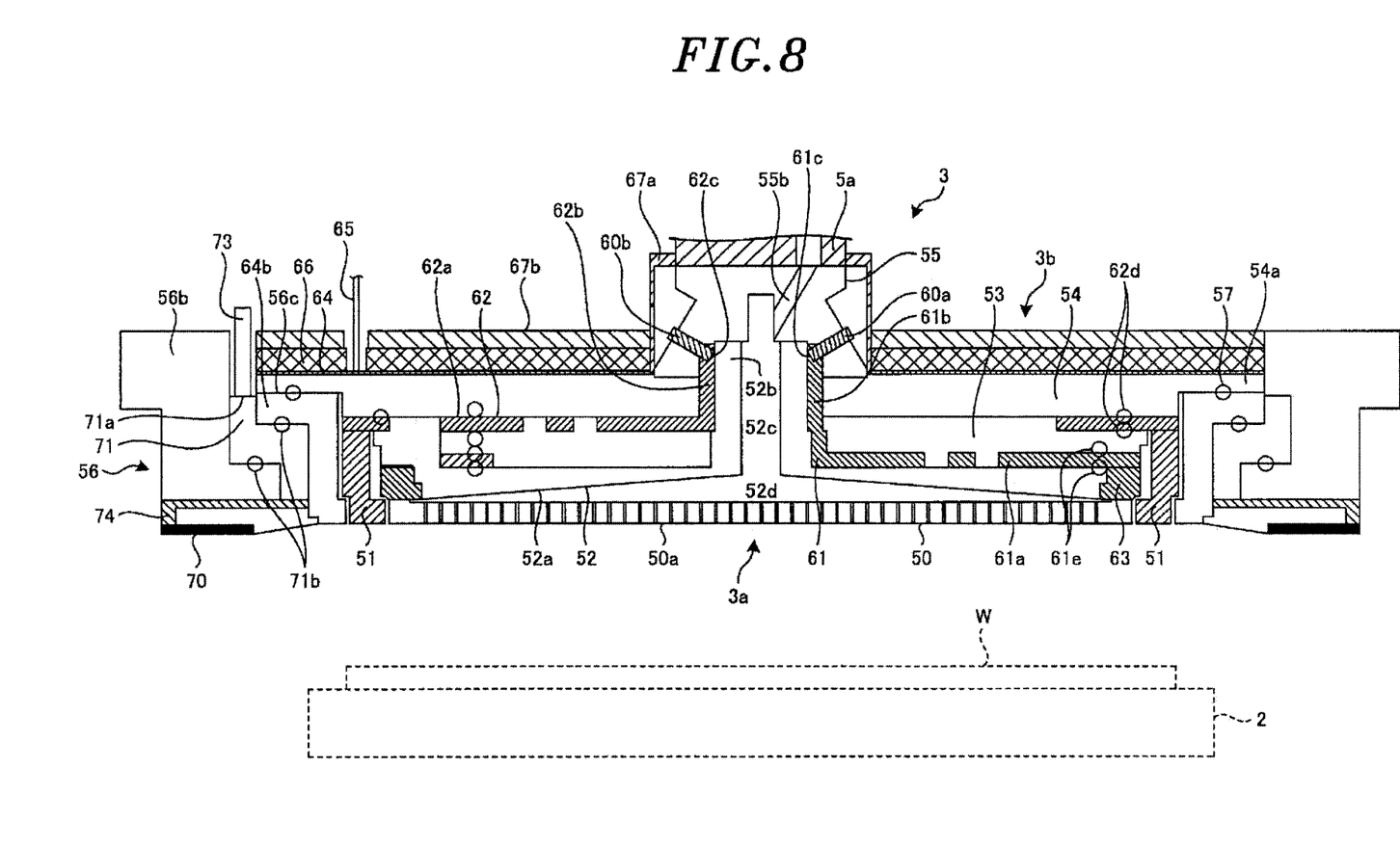
FIG. 8 is a cross-sectional view showing an example of a configuration of an upper electrode according to a fourth embodiment.

FIG. 8 is a cross-sectional view showing an example of a configuration of an upper electrode according to the fourth embodiment. Since an upper electrode 3 according to the fourth embodiment has the same configuration in part as the upper electrode 3 according to the third embodiment, like reference numerals will be given to like parts and redundant description thereof will be omitted. Thus, the differences will be mainly described.

In the upper electrode 3 according to the fourth embodiment, a peripheral electrode 70 is disposed at an outer edge of the counter surface 3a. The peripheral electrode 70 is electrically connected to the power supply electrode 71 through a conductive portion 74.

In the plasma processing apparatus 100, in the case of performing film formation as the plasma treatment, deposits are likely to be deposited at a portion where the temperature of plasma decreases. For example, in the plasma processing apparatus 100, deposits are likely to be deposited around the gas exhaust duct 13. In the plasma processing apparatus 100, in order to remove the deposits, a cleaning gas is supplied from the upper electrode 3 to the processing space 38 and the powers of predetermined frequencies are supplied to the central electrode 50 and the peripheral electrode 51 to generate plasma. Thus, the cleaning is performed. The cleaning gas may be, e.g., a reactant gas such as a fluorine-based gas, a chlorine-based gas, or the like. However, even if the cleaning is performed in plasma processing apparatus 100, it is difficult to supply ions or particles having sufficient energy to the vicinity of the gas exhaust duct 13. Accordingly, the deposits cannot be sufficiently removed.

Therefore, in the plasma processing apparatus 100 according to the fourth embodiment, the peripheral electrode 70 is used to clean the deposits. In the case of cleaning the deposits, the controller 6 controls the second RF power supply 46 to supply the powers of predetermined frequencies to the central electrode 50 and the peripheral electrodes 51 and 70 to generate plasma. Accordingly, in the plasma processing apparatus 100 according to the fourth embodiment, ions or particles having sufficient energy can be supplied to the vicinity of the gas exhaust duct 13 to remove the deposits. In the case of cleaning only the vicinity of the gas exhaust duct 13, the controller 6 may control the second RF power supply 46 to supply a power of a predetermined frequency to the peripheral electrode 70 to generate plasma.

As described above, in the upper electrode 3 of the fourth embodiment, the peripheral electrodes 51 and 70 having different diameters are arranged in parallel on the counter surface 3a. The peripheral electrode 70 is disposed at the outer edge of the counter surface 3a. Therefore, the plasma processing apparatus 100 of the fourth embodiment can efficiently clean the deposits near the outer edge.

The presently disclosed embodiments are considered in all respects to be illustrative and not restrictive. The above-described embodiments can be embodied in various forms. Further, the above-described embodiments may be omitted, replaced, or changed in various forms without departing from the scope of the appended claims and the gist thereof.

For example, the case where the target object is a semiconductor wafer has been described as an example in the above-described embodiments. However, the target object is not limited thereto, and may be another substrate such as a glass substrate or the like.

Further, the case where the upper electrode 3 includes one or two peripheral electrodes has been described as an example in the above-described embodiments. However, the present disclosure is not limited thereto, and the upper electrode 3 may include three or more peripheral electrodes.

Further, the case where the gas diffusion space is formed in the upper electrode 3 has been described as an example in the above-described embodiments. However, the present disclosure is not limited thereto, and the upper electrode 3 may be formed in a ring shape having a slit(s) through which a gas passes. Further, the upper electrode 3 may have a configuration in which the counter surface 3a is divided into a plurality of regions so that gases can be injected at individually controlled flow rates from the respective regions.

Further, in the above-described embodiments, the frequency of the RF power applied to the upper electrode 3 and the substrate support 2 is 13.56 MHz. However, the frequency of the RF power is not limited thereto, and may be, e.g., 2 MHz to 60 MHz.

Further, in the above-described embodiments, the RF power is applied to the upper electrode 3. However, a direct-current (DC) power may be applied to the upper electrode 3.

Further, in the above-described embodiments, the case where the plasma processing apparatus 100 performs film formation by generating plasma through the upper electrode 3 has been described as an example. However, the present disclosure is not limited thereto, and the plasma processing apparatus 100 may perform another plasma treatment such as etching or the like by generating plasma through the upper electrode 3.

DESCRIPTION OF REFERENCE NUMERALS

1: processing chamber
2: substrate support
3: upper electrode
3a: counter surface
3b: upper surface
6: controller
45: matching unit
46: second RF power supply
50: central electrode
51: peripheral electrode
52 to 56: dielectric bodies
57: seal
60a and 60b: power supply terminal
61: power supply electrode
61a: annular portion
61b: conductive wiring portion
61e: seal
62: power supply electrode
62a: annular portion
62b: conductive wiring portion
62c: power supply point
62d: seal
64: heater
65: wiring
66: heat insulating material 67a and 67b: conductive shield member
100: plasma processing apparatus
W: wafer

The invention claimed is:
1. An upper electrode comprising:
a central electrode disposed on a counter surface of the upper electrode facing a substrate support, on which a target object that is a plasma processing target is placed, at a position corresponding to a central portion of the substrate support;
one or more peripheral electrodes disposed on the counter surface to encircle a periphery of the central electrode;
multiple dielectric bodies laminated between the counter surface and a surface of the upper electrode opposite to the counter surface; and
multiple power supply electrodes arranged between the multiple dielectric bodies to electrically connect the central electrode and the one or more peripheral electrodes respectively to power supply terminals that are individually disposed at the surface opposite to the counter surface,
wherein each of the power supply electrodes has an annular portion and a plurality of conducting wire portions, and
one ends of the conductive wiring portions are connected to one another at a power supply point, the other ends of the conducting wire portions are connected to multiple points on a circumference of the annular portion, and the conducting wire portions are partially curved and bent so that lengths of the conducting wire portions from the power supply point to the annular portion are equal to one another.

2. The upper electrode of claim 1, wherein each of the multiple power supply electrodes is electrically connected to the central electrode or the one or more peripheral electrodes at the annular portion.

3. The upper electrode of claim 2, wherein the multiple dielectric bodies are laminated with predetermined gaps therebetween, and
each of the power supply electrodes is provided with a seal extending along a circumferential direction of the annular portion to seal off the atmosphere.

4. The upper electrode of claim 1, wherein the one or more peripheral electrodes includes a plurality of peripheral electrodes having different diameters arranged in parallel on the counter surface, and
the power supply electrodes for the peripheral electrodes electrically connect the peripheral electrodes to the power supply terminals disposed at the surface opposite to the counter surface, respectively.

5. The upper electrode of claim 1, further comprising:
a heater disposed to cover at least a part of the surface opposite to the counter surface and generates heat by power supplied through a noise removing filter; and
one or more conductive shield members disposed to cover the entire surface opposite to the counter surface from a position above the heater.

6. The upper electrode of claim 1, further comprising:
one or more conductive shield members disposed to cover the entire surface opposite to the counter surface; and
a heater disposed to cover at least a part of an upper portion of the shield member and generates heat by power supplied thereto.

7. The upper electrode of claim 1, wherein one of the one or more peripheral electrodes is disposed at an outer edge of the counter surface.

8. A plasma processing apparatus comprising:
a substrate support on which a target object that is a plasma processing target is placed; and
an upper electrode including a central electrode disposed on a counter surface of the upper electrode facing the substrate support at a position corresponding to a central portion of the substrate support, one or more peripheral electrodes disposed on the counter surface to encircle a periphery of the central electrode, multiple dielectric bodies laminated between the counter surface and a surface of the upper electrode opposite to the counter surface, and multiple power supply electrodes arranged between the dielectric bodies to electrically connect the central electrode and the peripheral electrodes respectively to power supply terminals that are individually disposed at the surface opposite to the counter surface,
wherein each of the power supply electrodes has an annular portion and a plurality of conducting wire portions, and
one ends of the conductive wiring portions are connected to one another at a power supply point, the other ends of the conducting wire portions are connected to multiple points on a circumference of the annular portion, and the conducting wire portions are partially curved and bent so that lengths of the conducting wire portions from the power supply point to the annular portion are equal to one another.

9. The plasma processing apparatus of claim 8, further comprising:
a power supply connected to the power supply terminals and configured to supply powers of predetermined frequencies to the central electrode and the peripheral electrodes through the power supply terminals, respectively; and
a controller configured to control the powers supplied from the power supply to the central electrode and the peripheral electrodes such that a plasma density has a predetermined gradient during a plasma treatment.

10. The plasma processing apparatus of claim 9, wherein at least one of a variable capacitor and an impedance control circuit is disposed in respective supply paths for supplying the powers from the power supply to the central electrode and the peripheral electrode, and at least one of a capacitance and an impedance is controlled.

11. The plasma processing apparatus of claim 8, wherein the conducting wire portions are formed in different shapes.

12. The plasma processing apparatus of claim 8, wherein the power supply point is positioned around a center of the power supply electrode.

13. The upper electrode of claim 1, wherein the conducting wire portions are formed in different shapes.

14. The upper electrode of claim 1, wherein the power supply point is positioned around a center of the power supply electrode.

* * * * *